United States Patent
Wada et al.

(10) Patent No.: US 8,074,127 B2
(45) Date of Patent: Dec. 6, 2011

(54) SIGNAL ANALYZING APPARATUS

(75) Inventors: Takeshi Wada, Ebina (JP); Hajime Imazeki, Isehara (JP); Takashi Miyamoto, Hadano (JP)

(73) Assignee: Anritsu Corporation, Atsugi-shi (JP)

( * ) Notice: Subject to any disclaimer, the term of this patent is extended or adjusted under 35 U.S.C. 154(b) by 410 days.

(21) Appl. No.: 12/295,179

(22) PCT Filed: Mar. 29, 2007

(86) PCT No.: PCT/JP2007/056769
§ 371 (c)(1),
(2), (4) Date: Feb. 6, 2009

(87) PCT Pub. No.: WO2007/114206
PCT Pub. Date: Oct. 11, 2007

(65) Prior Publication Data
US 2011/0050705 A1 Mar. 3, 2011

(30) Foreign Application Priority Data

Mar. 31, 2006 (JP) .................................. 2006-098790

(51) Int. Cl.
*G01R 31/28* (2006.01)
*G01R 13/02* (2006.01)
(52) U.S. Cl. .......................................... 714/704; 702/67
(58) Field of Classification Search ................. 714/57, 714/704–708; 702/66, 67
See application file for complete search history.

(56) References Cited

U.S. PATENT DOCUMENTS
4,949,252 A * 8/1990 Hauge .............................. 714/46
(Continued)

FOREIGN PATENT DOCUMENTS
JP A 7-218603 8/1995
(Continued)

OTHER PUBLICATIONS

Dean, E.J.; Dresseihaus, P.D.; Przybysz, J.X.; Miklich, A.H.; Hodge Worsham, A.; Polonsky, S.V.;, "Bit error rate measurements for GHz code generator circuits," Applied Superconductivity, IEEE Transactions on , vol. 9, No. 2, pp. 3598-3601, Jun. 1999doi: 10.1109/77.783808 URL: http://ieeexplore.ieee.org/stamp/stamp.jsp?tp=&arnumber=783808&isnumber=17.*

(Continued)

*Primary Examiner* — Cynthia Britt
(74) *Attorney, Agent, or Firm* — Greer, Burns & Crain, Ltd.

(57) ABSTRACT

The present invention is to provide a signal analyzing apparatus which can easily identify a pattern high in error rate and a pattern causing bit errors in comparison with the conventional device. In a signal analyzing apparatus (4) for analyzing a signal from an object under test, and having a display unit (21) display an analysis result on the signal, the signal analyzing apparatus (4) includes a statistical processing unit (34) for statistically processing the analysis result for each of divided sections obtained by dividing an analysis section set for the signal; and a display control unit (23) for causing the display device to display statistical results obtained by the statistical processing unit for each of the divided sections, when a divided section are identified as a new analysis section, the statistical processing unit performs statistical processing of the analysis result for each of divided sections obtained by dividing the new analysis section, the display control unit causes the display device to display the statistical results obtained by the statistical processing unit for each of new divided sections.

8 Claims, 6 Drawing Sheets

U.S. PATENT DOCUMENTS

| | | | |
|---|---|---|---|
| 5,761,216 A | | 6/1998 | Sotome et al. |
| 6,009,545 A * | | 12/1999 | Tsutsui et al. ............... 714/718 |
| 6,684,350 B1 * | | 1/2004 | Theodoras et al. ........... 714/712 |
| 7,434,113 B2 * | | 10/2008 | Miller et al. ................. 714/700 |
| 7,634,693 B2 * | | 12/2009 | Miller et al. ................. 714/700 |
| 2003/0212929 A1 * | | 11/2003 | Sekizawa ....................... 714/47 |
| 2004/0123208 A1 * | | 6/2004 | Miller et al. ................. 714/744 |

FOREIGN PATENT DOCUMENTS

| | | |
|---|---|---|
| JP | A 7-225263 | 8/1995 |
| JP | A 8-279839 | 10/1996 |
| JP | A 2001-111531 | 4/2001 |
| JP | A 2004-128981 | 4/2004 |

OTHER PUBLICATIONS

Kromat, O.; Langmann, U.; Hanke, G.; Hillery, W.J.; , "A 10 Gb/s silicon bipolar IC for PRBS testing," Solid-State Circuits Conference, 1996. Digest of Technical Papers. 42nd ISSCC., 1996 IEEE International , vol. No. pp. 206-207, 446, Feb. 1996 doi: 10.1109/ISSCC.1996.488573URL: http://ieeexplore.ieee.org/stamp/stamp.jsp?tp=&arnumber=488573&isnum.*

Chi-Yuan Chang; Jin-Jang Loon; , "Detection and elimination of 2-D transmission error patterns in DPCM images," Communications, IEEE Transactions on , vol. 44, No. 10, pp. 1251-1256, Oct. 1996 doi: 10.1109/26.539765 URL: http://ieeexplore.ieee.org/stamp/stamp.jsp?tp=&arnumber=539765&isnumber=11672.*

* cited by examiner

SIGNAL ANALYZING APPARATUS

This application is a U.S. National Phase under 35 U.S.C. §371, of International Application No. PCT/JP2007/056769, filed Mar. 29, 2007.

FIELD OF THE INVENTION

The present invention relates to a signal analyzing apparatus, and more particularly to a signal analyzing apparatus for analyzing a signal from an object under test.

BACKGROUND OF THE INVENTION

As an example, a conventional signal analyzing apparatus is designed to detect a bit error from an arbitrary section designated in a pattern of a signal outputted from an object under test to measure a bit error rate. The conventional signal analyzing apparatus comprises a pattern position detecting unit, a pattern generating unit, an error counter and a verification unit. The pattern position detecting unit is operable to output a count enable signal when detecting the designated section from the pattern in response to a synchronization signal from the pattern generating unit. The pattern generating unit stores therein patterns of bits to be used for checking the signal outputted from the object under test. The error counter is operable to start and stop counting the number of bit errors in response to a bit error detection signal outputted from the verification unit when receiving the count enable signal from the pattern position detecting unit (refer to for example patent document 1).

Patent document 1: Japanese Patent Laying-Open Publication No. H07-225263

DISCLOSURE OF THE INVENTION

Problems to be solved by the Invention

The above-mentioned conventional signal analyzing apparatus can measure a bit error rate in the arbitrary section of a pattern of bits indicated by the signal outputted from the object under test. However, by using the above-mentioned conventional signal analyzing apparatus, it is difficult for an operator to identify a pattern that is high in error rate and a pattern that causes bit errors among the pattern indicated by the signal outputted from the object under test.

It is therefore an object of the present invention to provide a signal analyzing apparatus which can easily identify a pattern that is high in error rate and a pattern that causes bit errors in comparison with the conventional signal analyzing apparatus.

In a signal analyzing apparatus according to the present invention for performing an analysis of a signal from an object under test to have a display unit display an analysis result of the signal, the signal analyzing apparatus comprises: a statistical processing unit for performing statistical processing of the analysis result for each of a plurality of divided sections obtained by dividing an analysis section set for the signal; and a display control unit for causing the display device to display statistical results obtained by the statistical processing unit for each of the divided sections, wherein when one of the divided sections is identified as a new analysis section, the statistical processing unit performs statistical processing of the analysis result for each of the new divided sections obtained by dividing the new analysis section, the display control unit causes the display device to display the statistical results obtained by the statistical processing unit for each of the new divided sections obtained by dividing the new analysis section.

The signal analyzing apparatus according to the present invention thus constructed can designate a new analysis section from among the divided sections obtained by dividing the analysis section set for the signal from the object under test to easily identify a pattern that is high in error rate and a pattern that causes bit errors in comparison with the conventional signal analyzing apparatus.

In the signal analyzing apparatus according to the present invention, when two or more divided sections are identified as a new analysis section, the statistical processing unit performs statistical processing of an analysis result for each of the new divided sections obtained by dividing the new analysis section, the display control unit causes the display device to display the statistical results obtained by the statistical processing unit for each of the new divided sections obtained by dividing the new analysis section.

The signal analyzing apparatus according to the present invention can easily identify a pattern that is high in error rate and a pattern that causes bit errors in comparison with the conventional signal analyzing apparatus by hierarchically designating an analysis section.

In the signal analyzing apparatus according to the present invention, the statistical processing unit may perform statistical processing of bit errors of the signal.

In the signal analyzing apparatus according to the present invention, the statistical processing unit comprises: a plurality of error counters for performing statistical processing of the analysis result; a distribution deciding unit for deciding on how to distribute the analysis result to the error counters by identifying the analysis result with the divided sections; and a distributing unit for distributing the analysis result to the error counter on the basis of the decision made by the distribution deciding unit.

The device test system according to the present invention comprises: a test signal generating unit for generating a test signal to be outputted to an object under test; and a signal analyzing apparatus as described above, wherein the object under test outputs a signal in response to the test signal, the signal analyzing apparatus analyzes the signal from the object under test to have a display unit display an analysis result.

The device test system according to the present invention thus constructed can designate a new analysis section from among the divided sections obtained by dividing the analysis section set for the test from the object under test to easily identify a pattern that is high in error rate and a pattern that causes bit errors in comparison with the conventional signal analyzing apparatus.

The test signal analyzing method according to the present invention, comprises: a step of analyzing a signal, from an object under test, for each of divided sections obtained by dividing an analysis section set for a signal; a step of performing statistical processing of an analysis result of the signal for each of a plurality of the divided sections; a step of selecting one divided section or a series of divided sections on the basis of statistical results displayed; a step of setting, as a new analysis section, the divided section selected or the series divided sections selected; and a step of analyzing a signal newly received from the object under test for each of the divided sections obtained by dividing the new analysis section.

Advantageous Effect of the Invention

The present invention is to provide a signal analyzing apparatus which can easily identify a pattern that is high in error rate and a pattern that causes bit errors in comparison with the conventional signal analyzing apparatus.

Figure 1:
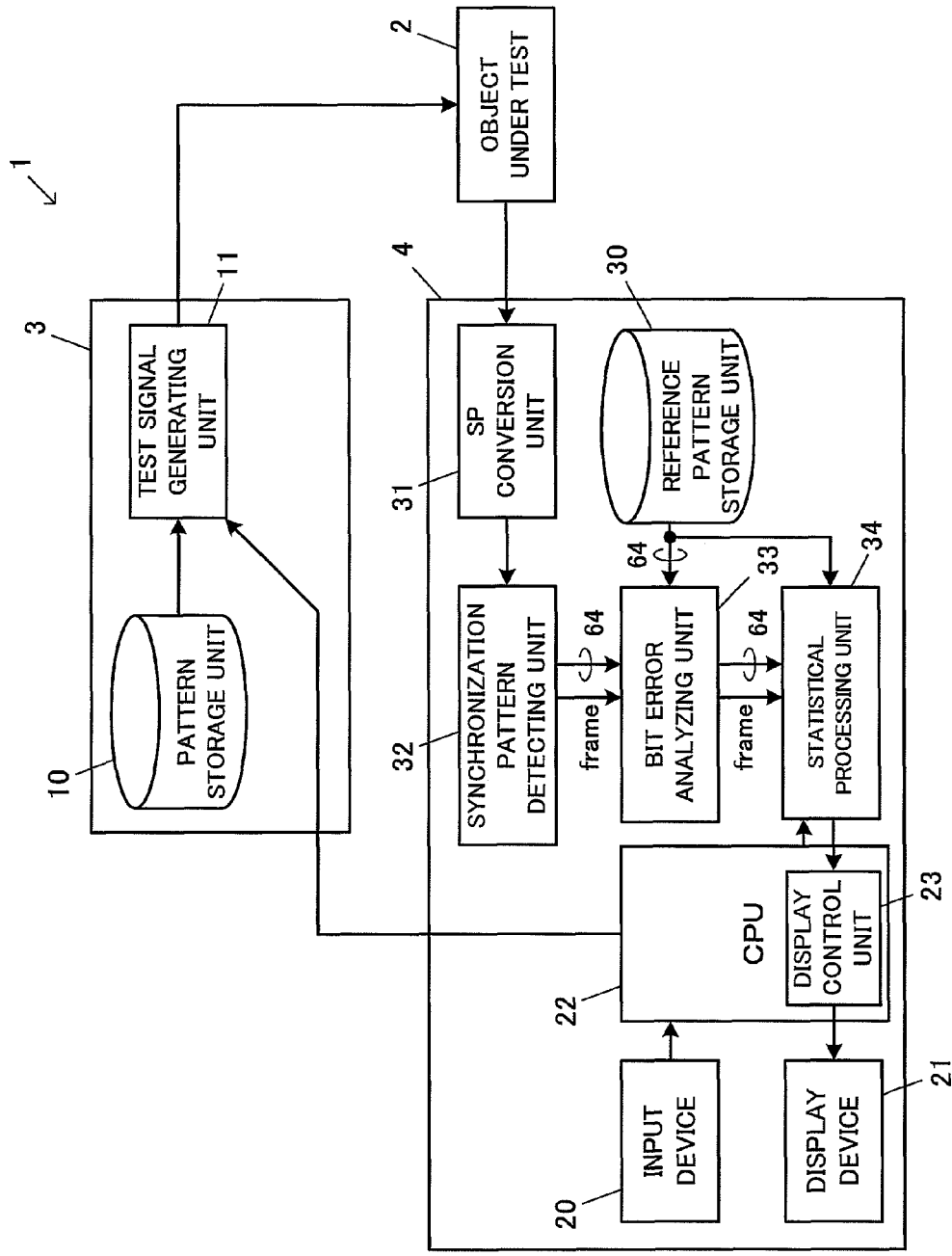
FIG. 1 is a block diagram showing a device test system according to one preferred embodiment of the present invention.

1: device test system
2: object under test
3: test signal generating device
4: signal analysis apparatus
10: pattern storage unit
11: test signal generating unit
20: input device
21: display device
22: CPU
23: display control unit
30: reference pattern storage unit
31: SP conversion unit
32: synchronization pattern detecting unit
33: bit error analyzing unit
34: statistical processing unit
40: error counter
41: distribution deciding unit
42: distributing unit

PREFERRED EMBODIMENT OF THE INVENTION

One preferred embodiment of the device test system according to the present invention will be described hereinafter with reference to the drawings.

FIG. 1 is a block diagram showing the device test system according to the preferred embodiment of the present invention.

The device test system 1 comprises a test signal generating device 3 for generating a test signal to be used for testing an object 2 which outputs a signal in response to the test signal, and a signal analyzing apparatus 4 for analyzing the signal transmitted from the object 2 under test.

In this embodiment, the object 2 under test is exemplified by a relay device, a transmission cable, and the like for receiving a test signal and sending it as it is.

The test signal generating device 3 comprises a pattern storage unit 10 having patterns for a test signal, and a test signal generating unit 11 for generating a test signal having a pattern selected from among patterns stored in the pattern storage unit 10.

In this embodiment, the pattern storage unit 10 is constituted by a storage medium such as a random access memory (RAM) and the like. The pattern storage unit 10 and the test signal generating device 3 are collectively constituted by a field programmable gate array (FPGA).

The following description is directed to a case that the test signal generating unit 11 generates a test signal including a frame synchronization signal on the basis of the patterns stored in the pattern storage unit 10. Here, a pattern of each frame is the same as a pattern selected from among the patterns stored in the pattern storage unit 10.

The signal analyzing apparatus 4 comprises an input device 20 constituted by a key board, a pointing device and the like, a display device 21, a central processing unit (CPU) 22 for executing a program for controlling the device test system 1, a reference pattern storage unit 30 having reference patterns corresponding to the respective patterns stored in the pattern storage unit 10, a SP conversion unit 31 for serial-parallel (hereinafter simply referred to as "SP") conversion of a signal received from the object 2 under test, a synchronization pattern detecting unit 32 for detecting a synchronization pattern from the signal received from the object 2 under test, a bit error analyzing unit 33 for analyzing the signal received from the object 2 under test, and detecting a bit error by comparing a pattern indicated by parallel signals produced by the SP conversion unit 31 with each of the reference patterns, and a statistical processing unit 34 for taking statistics of the bit error analyzed by the bit error analyzing unit 33.

In this embodiment, the reference pattern storage unit 30 is constituted by a storage medium such as a Random Access Memory (RAM) and the like. The SP conversion unit 31, the synchronization pattern detecting unit 32, the bit error analyzing unit 33, and the statistical processing unit 34 are integrally constructed by a field programmable gate array (FPGA). The CPU 22 is provided with a display control unit 23 for controlling the display device 21.

The input device 20, the display device 21, and the CPU 22 may be respectively constituted by external devices connected to the device test system 1.

In this embodiment, the SP conversion unit 31 is operative to convert the signal received from the object 2 under test into 64-bit parallel signals. In the following explanation, the number of the parallel signals produced by the SP conversion unit 31 from the signal received from the object 2 under test is simply referred to as a "parallel signal number".

The synchronization pattern detecting unit 32 is operative to produce a frame signal (as "frame" in figures) indicating the beginning position of each frame on the basis of the position of the synchronization pattern detected.

The bit error analyzing unit 33 is operative to receive, on the basis of the frame signal produced by the synchronization pattern detecting unit 32, a reference pattern from the reference pattern storage unit 30, and to calculate an exclusive logic addition of the received reference pattern and the pattern indicated by the parallel signals produced by the SP conversion unit 31 from the signal received from the object 2 under test.

Figure 2:
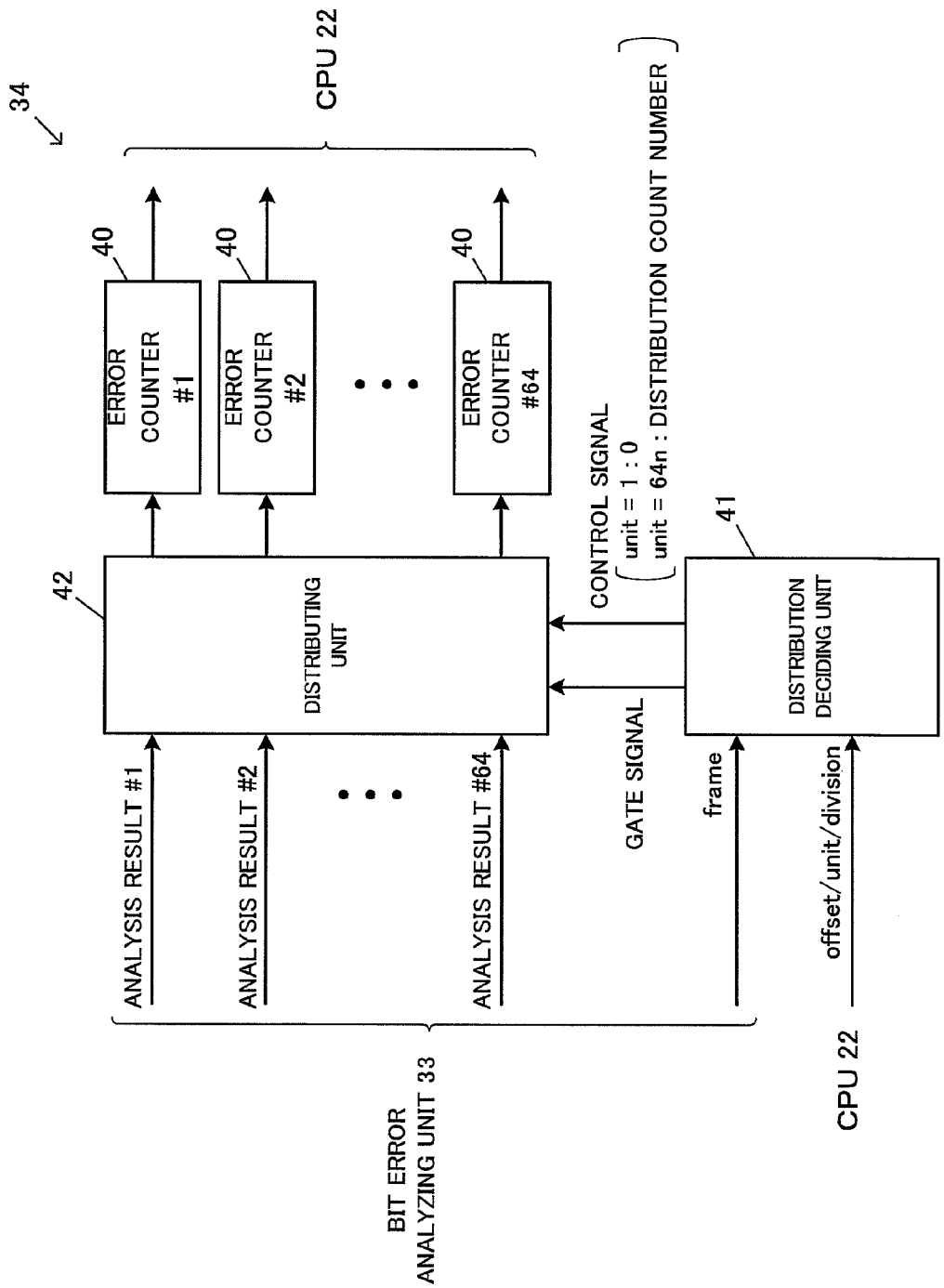
FIG. 2 is a block diagram showing a statistical processing unit of a signal analyzing apparatus according to one preferred embodiment of the present invention.

As shown in FIG. 2, the statistical processing unit 34 comprises a plurality of error counters 40 for counting the number of bit errors, a distribution deciding unit 41 for deciding on how to distribute, to the error counters 40, each analysis result regarding bit error obtained by the bit error analyzing unit 33, and a distributing unit 42 for distributing analysis result regarding bit error obtained by the bit error analyzing unit 33 to the error counters 40 on the basis of the decision made by the distribution deciding unit 41.

While there has been described in this embodiment about the fact that the statistical processing unit 34 comprises sixty four error counters 40 collectively constituting a statistical processing unit 34, the number of the error counters 40 collectively constituting a statistical processing unit 34 is not limited to the above number, but may be altered by any acceptable number according to the present invention.

The distribution deciding unit 41 is operative to receive the frame signal produced by the synchronization pattern detecting unit 32, and to receive a signal indicating a starting position for statistics, unit for statistics, and the number of statistics outputted from the CPU 22.

Figure 3:
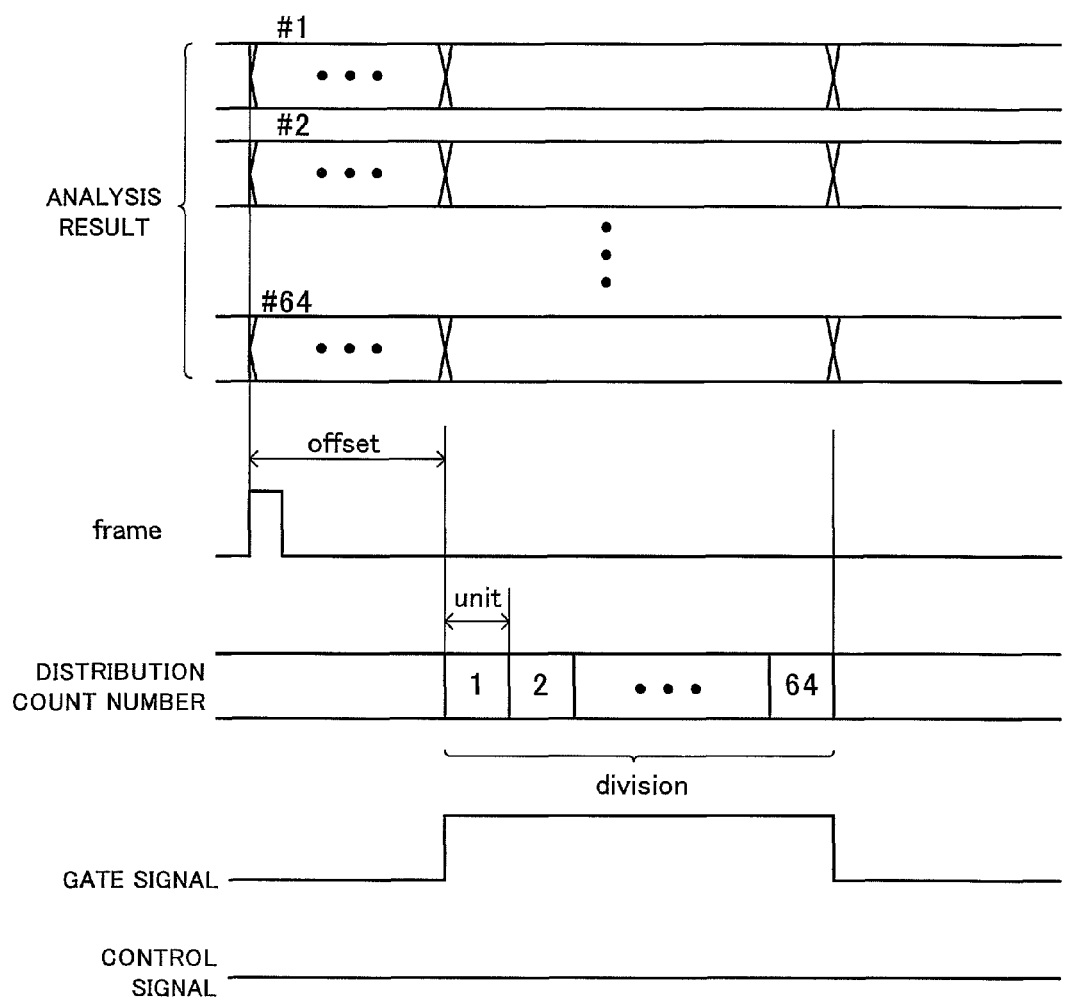
FIG. 3 is a first timing chart for explaining the statistical processing unit of the signal analyzing apparatus according to the preferred embodiment of the present invention.

As shown in FIG. 3, the starting position for statistics (see "offset" in FIG. 3) indicates, by unit of bit number for analysis result, a length between the beginning position indicated by the frame signal and the starting position for statistics of bit errors.

The unit for statistics (see "unit" in FIG. 3) indicates a bit number by which the analysis result is distributed to each of the error counters 40 from the starting position for statistics. If, for example, the unit for statistics is one bit, the analysis result are distributed every one bit to each of the error counters 40. If, on the other hand, the unit for statistics is 64 bits, the analysis result is distributed every 64 bits to each of the error counters 40.

The number of statistics (see "division" in FIG. 3) is equal to the number of the error counters 40 for counting the number of bit errors detected from the signal. Further, the number of statistics is limited by the CPU 22, and not more than the number of the error counter 40 forming part of the statistical processing unit 34.

The distribution deciding unit 41 is operative to start counting at the starting position for statistics, and to continue to count in every unit for statistics until the number of distribution (hereinafter simply referred to as "distribution count number") reaches the number of statistics.

The distribution deciding unit 41 is operative to output, to the distributing unit 42, a gate signal indicating a period of time during which the distribution count number is counted, and a control signal indicating a value "0", when the unit for statistics is one bit.

On the other hand, the distribution deciding unit 41 is operative to output, to the distributing unit 42, the gate signal and the control signal indicating the distribution count number when the unit for statistics is multiples of 64 bits.

The distributing unit 42 is operative to distribute the analysis result of each parallel signal to each error counter 40 when the value of the control signal indicates "0" in the period of time indicated by the gate signal.

On the other hand, the distributing unit 42 is operative to distribute the analysis result of all the parallel signals to the error counter 40 corresponding to the value of the control signal when the value of the control signal indicates either "1" or "64" in the period of time indicated by the gate signal.

FIG. 3 is a timing chart for explaining an operation to be performed when the unit for statistics is one bit. In this case, the distributing unit 42 serves to distribute the analysis result every one bit to each of the error counters 40. As a result, each of the error counters 40 acts to count the number of bit errors contained in each bit of the analysis result.

Figure 4:
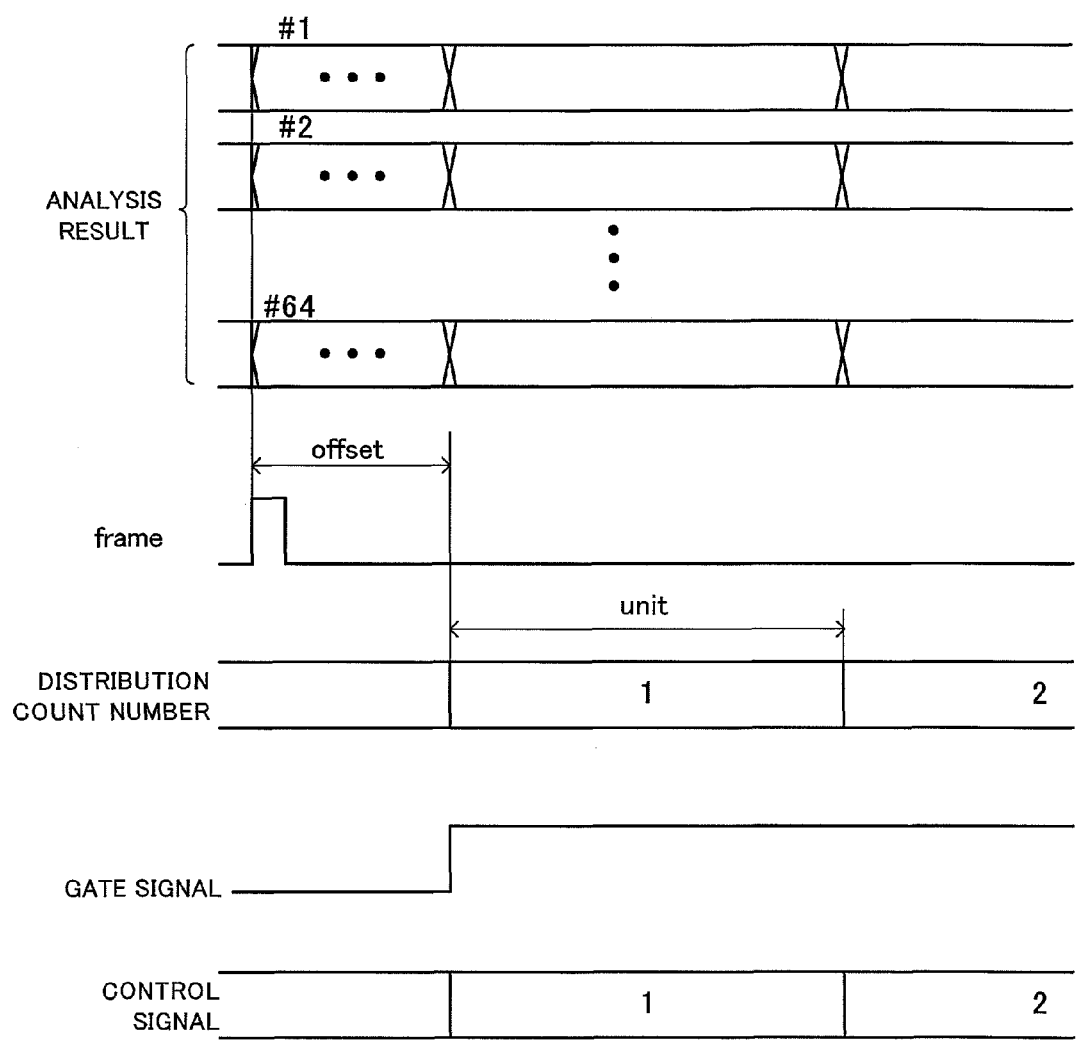
FIG. 4 is a second timing chart for explaining the statistical processing unit of the signal analyzing apparatus according to the preferred embodiment of the present invention.

On the other hand, FIG. 4 is a timing chart explaining an operation to be performed when the unit for statistics is 64 bits. In this case, the distributing unit 42 serves to distribute all the initial analysis result to the first error counter 40, and subsequently to distribute all the following analysis result to the second error counter 40. As a result, each of the error counters 40 acts to count the number of bit errors contained in 64 bits of the analysis result.

The CPU 22 is operative to calculate a bit error rate from the number of bit errors counted by each of the error counters 40, while the display control unit 23 is operative to have the display device 21 display the bit error rate calculated by the CPU 22.

Figure 5:
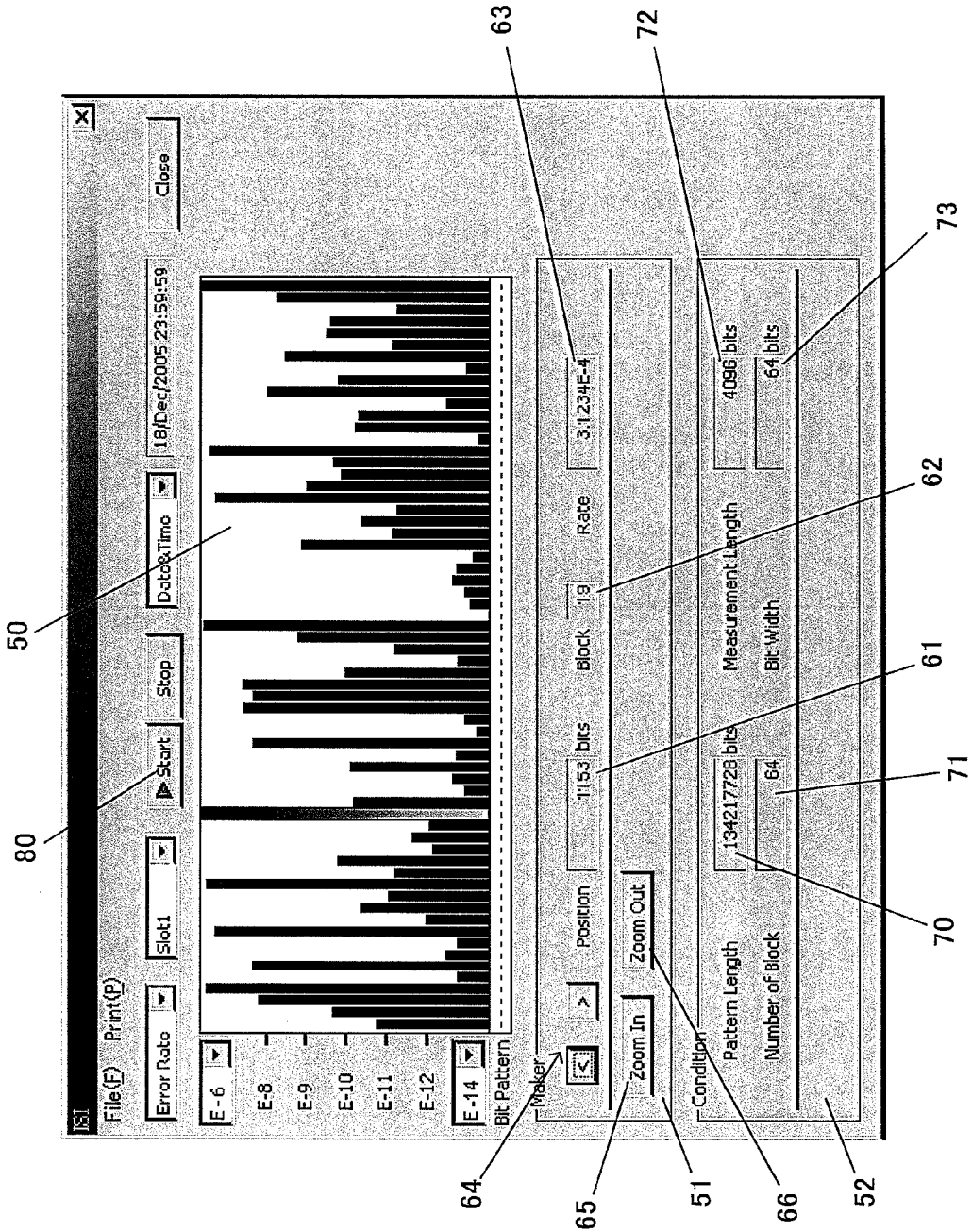
FIG. 5 is a first image on an operation screen displayed on a display device of the signal analyzing apparatus according to the preferred embodiment of the present invention.
Figure 6:
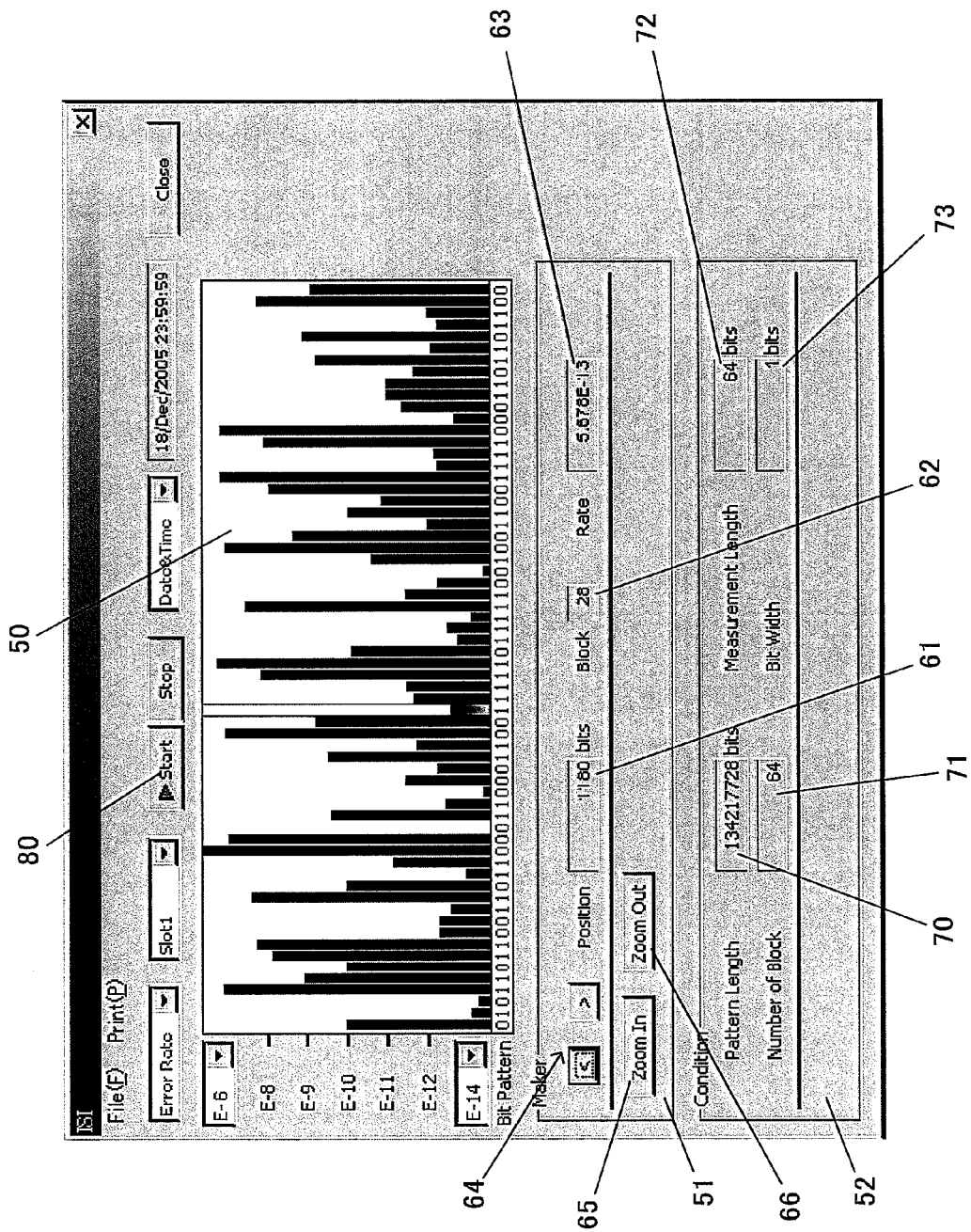
FIG. 6 is a second image on the operation screen displayed on the display device of the signal analyzing apparatus according to the preferred embodiment of the present invention.

Each of FIGS. 5 and 6 is an image of an operation screen displayed on the display device 21 by the display control unit 23.

As shown in FIG. 5, an analysis result area 50 on which the analysis result of the signal from the object 2 under test is displayed, a selection area 51 for selecting from among divided sections defined in an analysis section of the signal outputted from the object 2 under test, and an analysis status area 52 for indicating an analysis status of the signal outputted from the object 2 under test are arranged on the operation screen displayed on the display device 21. In this embodiment, the number of the divided sections defined in the analysis section is equal to 64.

The bit error rate is displayed in the analysis result area 50 in every divided section. Here, the bit error rate to be displayed in the analysis result area 50 in every divided section is calculated by the CPU 22 from the number of the bit errors counted by the error counters 40.

In the analysis result area 50, the bit error rate of a divided section selected by a selection area 51 is different in coloration or the like from the bit error rate of each of the remaining sections which do not selected by the selection area 51. Here, the nineteenth divided section is selected by the selection area 51 in FIG. 5.

The analysis result area 50 has a field 61 for displaying the leading bit position (statistics starting position) in the divided section under selection, a field 62 for displaying the order of the analysis section of the divided section under selection, a field 63 for displaying the bit error rate in the divided section under selection, a controller 64 for changing the divided section to be selected, a controller 65 for designating the divided section under selection as a new analysis section and the controller 66 for designating the analysis section as one divided section.

The analysis status area 52 has a field 70 for displaying the lengths of the reference patterns stored in the reference pattern storage unit 30, a field 71 for displaying the number of the divided sections (statistics number) in the analysis section, a field 72 for displaying the bit lengths in the analysis section, and a field 73 for displaying the bit lengths (unit for statistics) in each of the divided sections.

When an analysis start controller 80 is operated through the input device 20 on the operation screen thus constructed, the test signal generating unit 3 generates a test signal. The object 2 under test outputs a signal in response to the test signal generated by the test signal generating unit 3, while the bit error analyzing unit 33 of the test signal analyzing apparatus 4 analyzes the signal outputted from the object 2 under test.

When the analysis of the signal outputted from the object 2 under test is started, the CPU 22 outputs, to the statistical processing unit 34 from the CPU 22, a signal indicating, as the statistics starting position, a value obtained by dividing the position of the leading bit in the first divided section in the analysis section by the number of the parallel signals from the SP conversion unit 31, indicating the length of the divided section as unit for statistics, and indicating, as the number of statistics, the number of the divided sections in the analysis section.

The statistical processing unit 34 receives the signal, and then has the error counters 40 count the number of bit errors in each of the divided sections. As a result, the bit error rate in each of the divided sections is displayed in the analysis result area 50, and the bit error rate in the divided section under selection is displayed in the field 63.

When the controller 65 is operated through the input device 20 to designate the divided area under selection as a new section, the display device 21 is operated to have the operation screen display the divided section under selection as the new analysis section and to have signals indicative of a new statistics starting position, a new unit for statistics, and the number of statistics outputted to the statistical processing unit 34 from the CPU 22.

In response to this signal, the statistical processing unit 34 resets the error counters 40, and has the error counters 40 count the number of bit errors in each of the divided sections of the new analysis section.

As a consequence, the bit error rate calculated from the number of bit errors counted in each of the divided sections of the new analysis section is displayed in the analysis result area 50. The bit error rate corresponding to a divided section selected is displayed in the field 63.

When each of the divided sections is equal in length to 1 bit, the CPU 22 may display, in analysis result area 50, each bit of the reference pattern stored in the reference pattern storage unit 30 while relating each bit of the reference pattern to each of the divided sections on the analysis result area 50 as shown in FIG. 6.

When the current analysis section is identified as one of divided sections collectively forming a new analysis section by the controller 66 through the input device 20 on the operation screen shown in FIG. 6, the operation screen corresponding to the new analysis section is displayed by the display device 21 as shown in FIG. 5. On the operation screen, the bit error rate in each of the divided sections collectively forming the new analysis section is displayed in the analysis result area 50, while the bit error rate in a selected divided section is displayed in the field 63.

In FIGS. 5 and 6, each of the divided sections is decided on the basis of the analysis section and the number of the error counters 40 for counting the number of bit errors. In order to adapt to the case that the pattern is stretched over two divided sections contributing to the bit errors among the patterns having the test signals, the CPU 22 may be operated to shift the analysis starting position and the analysis finishing position in the analysis section in response to the operation through the input device 20.

From the foregoing description, it will be understood that the device test system 1 according to one embodiment of the present invention is constructed to designate a new analysis section from among the divided sections divided from the analysis section of the test signal, thereby making it possible to easily identify a pattern that is high in error rate and a pattern that causes bit errors in comparison with the conventional device test system.

Further, the device test system 1 has no need to preliminarily estimate a pattern that is high in error rate and a pattern that causes bit errors, and can easily identify a pattern that is high in error rate and a pattern that causes bit errors by performing one or more times an operation of changing and enlarging (Zoom Out) the analysis section, and of detailed display (Zoom In) on anyone of the analysis section in accordance with the statistical results (the number of bit errors, the bit error rate, and the like) of every divided section listed on a table at all times when the analysis section is set.

The invention claimed is:

1. A signal analyzing apparatus for performing an analysis of a signal outputted from an object under test to have a display unit display the analysis results of said signal, said signal indicating periodic frames, wherein each of said frames is formed by a pattern of bits and has the same analysis section identified therein, and said analysis is performed in bit units, said signal analyzing apparatus comprising:
   a statistical processing unit for performing statistical processing of said analysis result for each of a plurality of divided sections into which said analysis section have been equally divided; and
   a display control unit for causing said display device to display statistical results obtained by said statistical processing unit for each of said divided sections,
   wherein when one of said divided sections is identified as a new analysis section, said statistical processing unit performs statistical processing of said analysis results for each of a plurality of new divided sections into which said new analysis section have been equally divided, and said display control unit causes said display device to display said statistical results obtained by said statistical processing unit for each of new said divided sections.

2. A signal analyzing apparatus according to claim 1, wherein when two or more divided sections are identified as said new analysis section, said statistical processing unit performs statistical processing of said analysis results for each of a plurality of new divided sections into which said new analysis section has been equally divided, said display control unit causes said display device to display said statistical results obtained by said statistical processing unit for each of said new divided sections.

3. A signal analyzing apparatus according to claim 2, wherein said statistical processing unit performs statistical processing of bit errors of said signal.

4. A signal analyzing apparatus according to claim 2, wherein said statistical processing unit comprises:
   a plurality of error counters for performing statistical processing of said analysis results;
   a distribution deciding unit for deciding on how to distribute said analysis results to said error counters by identifying said analysis results with said divided sections; and
   a distributing unit for distributing said analysis results to said error counter on the basis of the decision made by said distribution deciding unit.

5. A signal analyzing apparatus according to claim 1, wherein said statistical processing unit performs statistical processing of bit errors of said signal.

6. A signal analyzing apparatus according to claim 1, wherein said statistical processing unit comprises:
   a plurality of error counters for performing statistical processing of said analysis results;
   a distribution deciding unit for deciding on how to distribute said analysis results to said error counters by identifying said analysis results with said divided sections; and
   a distributing unit for distributing said analysis results to said error counter on the basis of the decision made by said distribution deciding unit.

7. A device test system, comprising:
   a test signal generating unit for generating a test signal to be outputted to an object under test; and
   a signal analyzing apparatus for performing an analysis of a signal outputted from said object under test to have a display unit display the analysis results of said signal, said signal indicating periodic frames, wherein each of said frames is formed by a pattern of bits and has the same analysis section identified therein, and said analysis is performed in bit units, wherein said signal analyzing apparatus includes:
   a statistical processing unit for performing statistical processing of said analysis result for each of a plurality of divided sections into which said analysis section has been equally divided; and a display control unit for causing said display device to display statistical results obtained by said statistical processing unit for each of said divided sections, wherein when one of said divided sections is identified as a new analysis section, said statistical processing unit performs statistical processing of said analysis results for each of a plurality of new divided sections into which said new analysis section have been equally divided, and said display control unit causes said display device to display said statistical results obtained by said statistical processing unit for each of the new said divided sections, wherein:

said object under test outputs a signal in response to said test signal, and said signal analyzing apparatus analyzes said signal from said object under test to have the display unit display analysis results.

8. A test signal analyzing method of performing an analysis of a signal outputted from an object under test to have a display unit display analysis results of said signal, said signal indicating periodic frames, each of said frames being formed by a pattern of bits and having the same analysis section identified therein, and said analysis being performed in bit units, said test signal analyzing method comprising:

a step of performing statistical processing of said analysis results of said analysis results for each of a plurality of divided sections into which said analysis section have been equally divided;

a step of selecting one of said divided sections or a series of divided sections on the basis of the statistical results displayed;

a step of setting, as a new analysis section, said divided section that was selected or said series of divided sections that was selected.

* * * * *